United States Patent [19]

Sakuma et al.

[11] Patent Number: 5,323,173

[45] Date of Patent: Jun. 21, 1994

[54] DISPLAY DEVICE

[75] Inventors: Yasuaki Sakuma, Hitachi; Eiji Shimizu, Katsuta; Kiyoshi Konaka, Hitachi, all of Japan

[73] Assignees: Hitachi, Ltd., Tokyo; Hitachi Process Computer Engineering, Inc., Hitachi, both of Japan

[21] Appl. No.: 990,930

[22] Filed: Dec. 14, 1992

Related U.S. Application Data

[63] Continuation of Ser. No. 412,188, Sep. 25, 1989, abandoned.

[30] Foreign Application Priority Data

Sep. 26, 1988 [JP] Japan .................. 63-239032

[51] Int. Cl.$^5$ .............................................. G09G 1/06
[52] U.S. Cl. ...................................... 345/131; 345/134
[58] Field of Search ............... 340/721, 747, 731, 728, 340/734, 723, 724, 726, 750; 358/183; 345/127, 128, 129, 130, 131, 133, 134, 140, 118, 119, 121, 122, 123

[56] References Cited

U.S. PATENT DOCUMENTS

| | | | |
|---|---|---|---|
| 4,682,161 | 7/1987 | Bugg | 340/731 |
| 4,788,538 | 11/1988 | Klein et al. | 340/709 |
| 4,794,386 | 12/1988 | Bedrij et al. | 340/726 |
| 4,816,812 | 3/1989 | Iida | 340/721 |
| 4,847,785 | 7/1989 | Stephens | 340/722 |
| 4,860,218 | 8/1989 | Sleator | 340/747 |
| 4,891,770 | 1/1990 | Hollett | 340/731 |

FOREIGN PATENT DOCUMENTS

62-128369 of 0000 Japan .
213996 of 0000 Japan .
62-92071 10/1985 Japan .

*Primary Examiner*—Ulysses Weldon
*Assistant Examiner*—Xiao M. Wu
*Attorney, Agent, or Firm*—Antonelli, Terry, Stout & Kraus

[57] ABSTRACT

A display device having display memory and a display unit including a display plane for displaying contents of the display memory includes a boundary co-ordinate setting unit for setting co-ordinate values on the display plane of boundaries demarcating various display sections which are made by dividing a display area of the display plane into a plurality of areas, a co-ordinate memory for storing the set boundary co-ordinate values, an input data memory for storing input data having co-ordinate values corresponding to the display area of the display plane, a display scale factor setting unit for setting display scale factors of the input data of each of the display sections and a scale factor memory for storing the set display scale factors. A unit is provided for reading the display scale factors corresponding to the co-ordinate values of the input data read out from the input data memory on the basis of contents of the co-ordinate memory and the scale factor memory, and an operating unit is provided for operating enlargement or reduction of the co-ordinate values of the read input data in accordance with the read display scale factor, converting the co-ordinate values into display data and for supplying the display data to the display memory. A plurality of areas having different display scale factors of the input data can be displayed at the display area of the display plane.

29 Claims, 9 Drawing Sheets

DISPLAY DEVICE

This application is a continuation of U.S. patent application Ser. No. 412,188, filed on Sep. 25, 1989, now abandoned.

BACKGROUND OF THE INVENTION

This invention relates to a display device for displaying input data such as a trend graph which is sampled at constant period, and more particularly to a display device having edition function capable for displaying a plurality of data areas in which some of the data is enlarged and/or reduced.

In a conventional display device, for example, as disclosed in the J-P-A 61-290485, a part of data is enlarged and is displayed on the whole display area. However, according to the conventional display device, an enlarged and a reduced data areas cannot be mixed and displayed. Furthermore, data do not continue between an enlarged area and a non-enlarged area.

Namely, according to the conventional display device, a predetermined area of a graph is reduced or enlarged in order to easily observe the graph. However, display edition function for easily observing a relationship between the reduced or enlarged area and whole data is not considered in the conventional device, so that an operator cannot easily obtain regulated data from one graph.

SUMMARY OF THE INVENTION

The object of the invention is to overcome the disadvantages in the above-described conventional technology by providing a display device having edition function for an input data, the display device being capable for displaying a plurality of data areas in which an enlarged data area and a reduced data area are mixed and displayed on the same display area, keeping the continuation of the data between the part of the enlarged or reduced area and other area adjacent thereof.

In order to accomplish the above-described object, according to the invention, a display device having a display memory and display means including a display plane for displaying the contents of the display memory comprises,

- a boundary co-ordinate setting unit for setting co-ordinate values of boundaries demarcating various display sections which are made by dividing the display area of the display plane into a plurality of areas,
- a co-ordinate memory for storing the set boundary co-ordinate values,
- an input data memory for storing input data having co-ordinate values corresponding to the display areas of the display plane,
- a unit for setting display scale factors of the input data of each display section,
- a scale factor memory for storing the set display scale factors,
- a unit for reading the display scale factors corresponding to the co-ordinate values of the input data read out from the input data memory on the basis of the contents of the co-ordinate memory and the scale factor memory, and
- an operation unit for operating the enlargement or reduction of the co-ordinate values of the read input data in accordance with the read display scale factors, and for converting the co-ordinate values into display data, and for supplying the display data to the display memory.

A plurality of areas having different display scale factors of the input data can be displayed on the display area of the display plane.

As described above, the display area is divided into a plurality of display sections the a display scale factor is voluntarily set at each display section. Input data is enlarged or reduced with the display scale factor of the section corresponding to the input data, so that a display including plural enlarged and reduced areas on the same graph can be displayed, and the continuation of the input data between adjacent sections can be maintained.

Further, according to the preferred embodiment of the invention, the value of the scale of the display plane can be automatically set again in response to the change of the enlargement (reduction) section and the change of the rate of the enlargement (reduction).

Further, according to the preferred embodiment, the enlargement, reduction and looper can be automatically carried out in response with the condition of the input data.

Furthermore, according to the invention, the scrawl, the display of the background color at each section having the same scale factor and the change of kinds of lines can be carried out.

The looper means that the contents of the data to be partially enlarged and reduced are changed but the partial enlargement and reduction position of the display plane is not changed.

The scrawl means that the partial enlargement and reduction position of the display plane is changed but the contents of the data are changed.

Further, in the present invention, the background color can be displayed at each of the sections having the same scale factor preferably.

DESCRIPTION OF PREFERRED EMBODIMENT

The embodiments of the present invention will be described hereinafter with reference to the accompanied drawings.

Figure 1A:
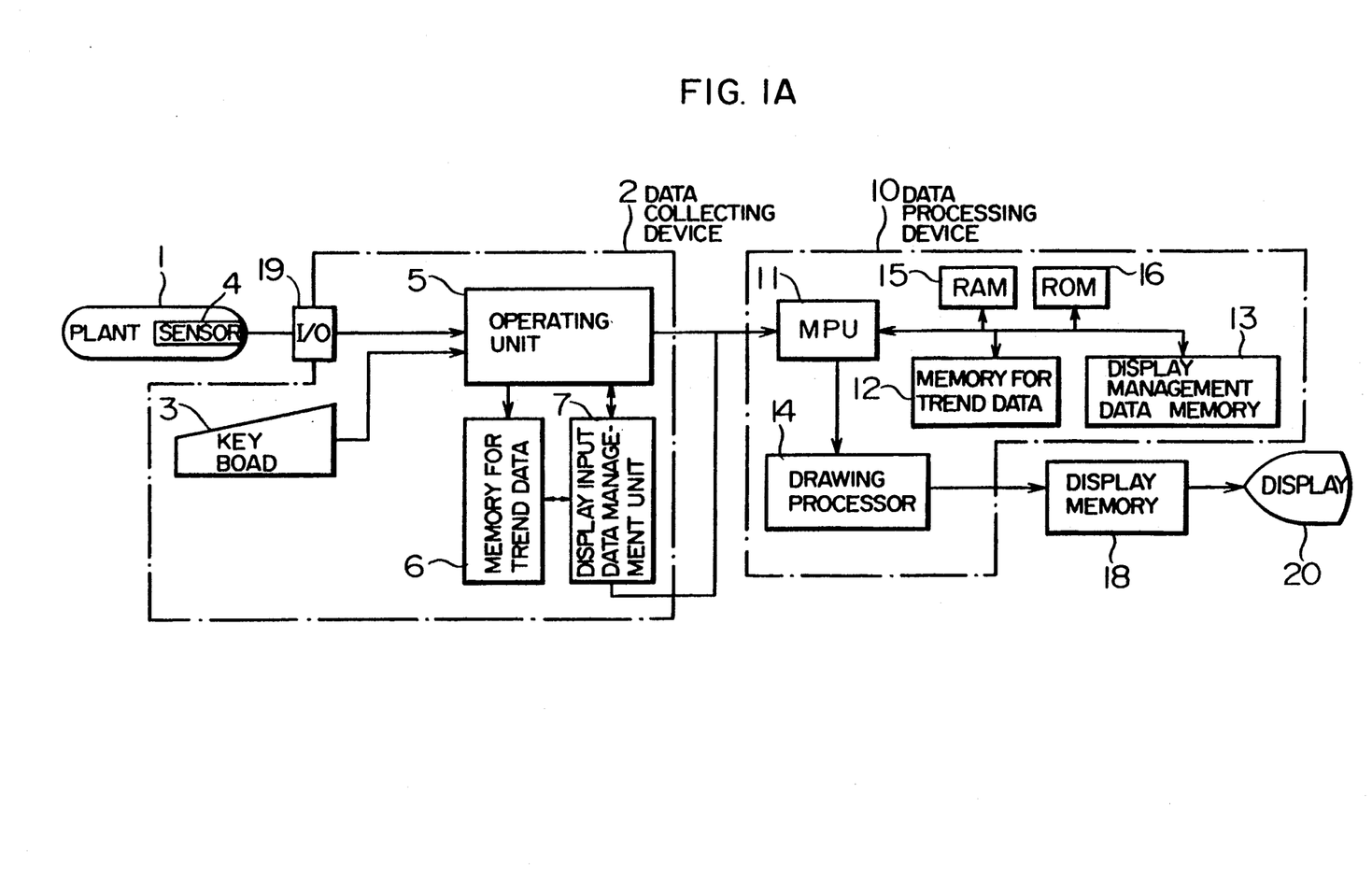
FIG. 1A is a block diagram showing a display device according to one embodiment of the present invention.

FIG. 1A is a block diagram showing a display device according to one embodiment of the present invention. In FIG. 1A, input data to be displayed on a display unit is supplied from a plant.

In the present invention, if the data displayed on the display unit is data for a graph, the data displayed on the display unit may be any kind of data. For example, the display of the data sampled at a constant period, such as data for trend graph, will be described.

In FIG. 1A, a reference numeral 1 shows a plant, and input data to be displayed is supplied to the data collecting device 2 through an input and output (I/O) interface 19. The data collecting device 2 includes an input unit such as key board 3, an operating unit 5, trend data memory 6 and display input data management unit 7. A sensor unit 4 is installed in the plant 1, supplying input data such as a temperature, water pressure etc. sampled at a constant period to the I/O interface 19. The key board 3 is operated by an operator, so that the input data to be displayed and a display scale factor (enlargement coefficient) of the input data in each display section are inputted from the key board 3. The trend graph display area on the display plane, the display section, display color and the like are designated from the key board 3, and these data is supplied to the operating unit 5.

The operating unit 5 receives data from the sensor unit 4, the key board 3 or the plant 1, processes the necessary data in the received data in response to the command from the key board 3, supplies the data to the memory 6 and the unit 7. The trend data memory 6 stores the input data (trend data) supplied from the operating unit. The display input data management unit 7 includes the information for managing the range of the data, which are stored in the memory 6, to be supplied to a data processing unit 10. For example, sampling data of the input data stored in the memory 6 may be supplied sequentially one by one, and the data may be displayed on the display plane one point by one point in accordance with the above-described information. Further, the input data in a predetermined range of the memory 6 may be supplied together, and the input data may be displayed together on the display plane in accordance with the above-described information. The information in the unit 7 may be preset, and the information may be set by the key board 3. The data processing device 10 operates on the data supplied from the data collecting device 2, converts the data into the display data, supplies the display data to a display memory 18. The data processing device 10 includes a microprocessing unit (MPU), 11 a trend data memory 12, a display management data memory 13, a random access memory (RAM) 15, a read only memory (ROM) 16 and a drawing processor 14. The MPU 11 operates on (namely, enlarges or/and reduces) the input trend data in the memory 12 on the basis of the data in the memory 13, processes and converts the co-ordinates of the input trend data into the display data, stores the display data into the trend data memory 12. Further, the MPU 11 sequentially supplies the stored display data to be displayed to the drawing processor 14. The data stored in the memory 13 may be preset. Furthermore, the data stored in the memory 13 may be supplied from the key board 3 or the plant 1. The drawing processor 14 develops the display data to picture element information, supplies the information to the display memory 18. The display memory 18 generates a display pattern from the picture element information, supplies the display pattern to a display unit 20, such as a cathode ray tube (CRT), a liquid crystal display or the like, so that trend graph is displayed at the display area of the display plane of the display unit.

The operating unit 5 includes a MPU, the ROM and a RAM. The display unit 20 may be a recording device such as an X-Y plotter.

Figure 1B:
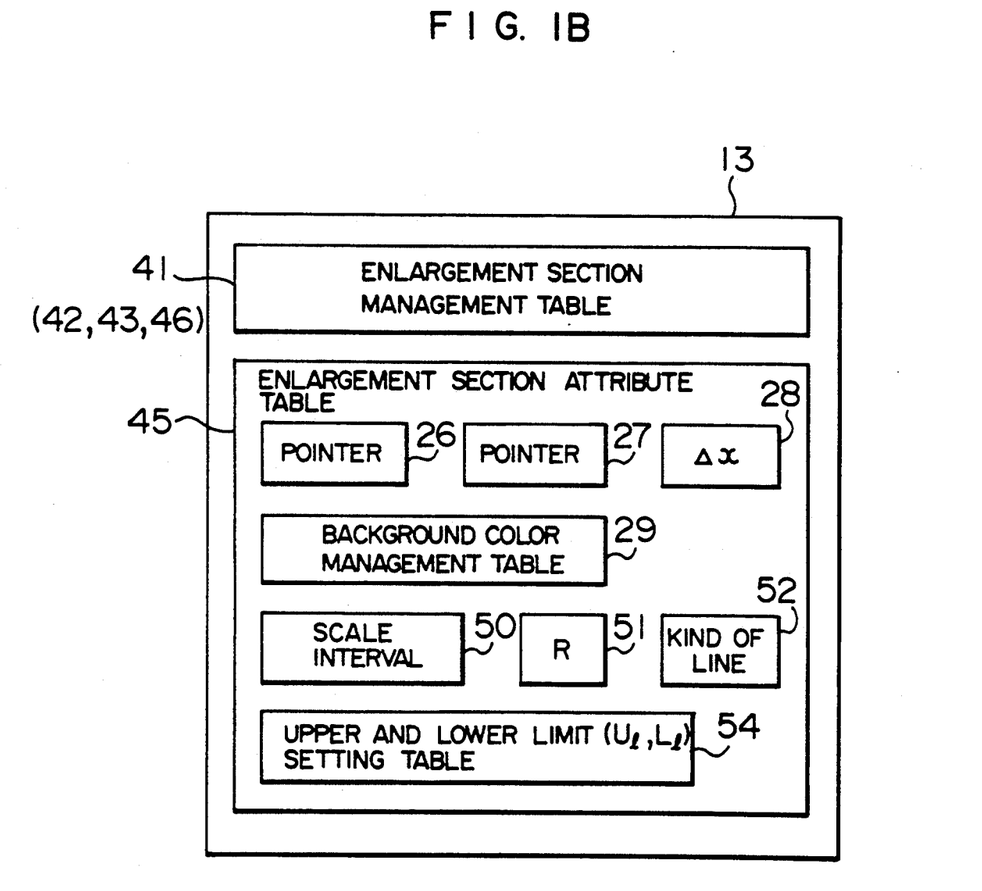
FIG. 1B is a drawing showing a detailed construction of a memory for display management data, as shown in FIG. 1A.

FIG. 1B shows the detailed construction of the display management data memory 13. The display management data memory 13 includes an enlargement section management table 41 and an enlargement section attribute table 45.

Figure 2:
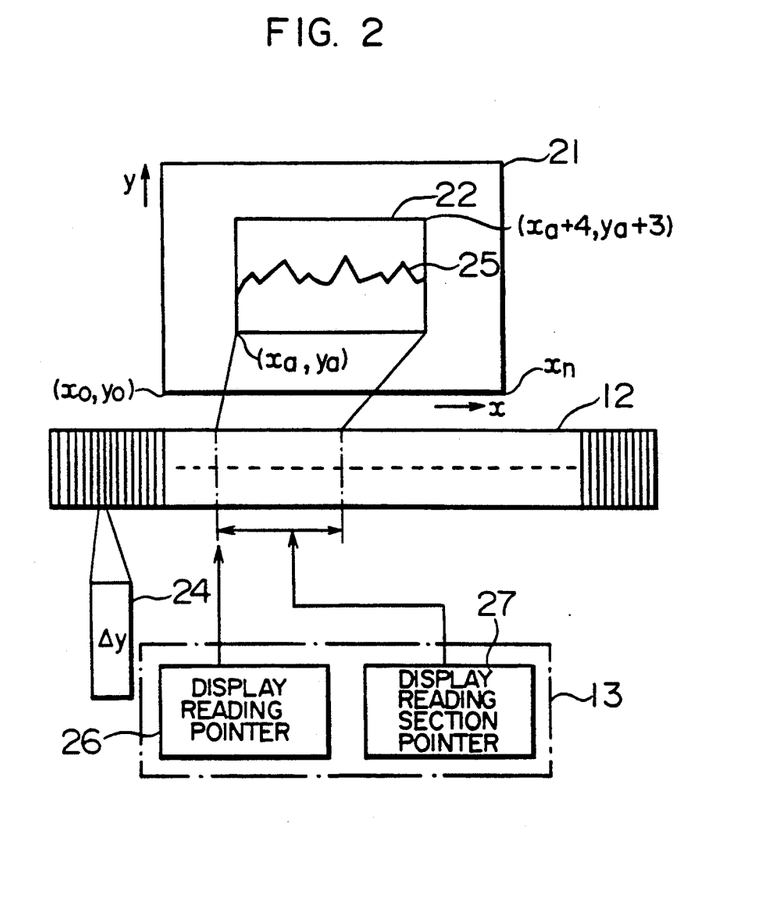
FIG. 2 is a drawing showing the relationship between data display by a display unit and data stored in a memory for trend data.

FIG. 2 shows the relationship between the contents of the memory 12 and the data displayed on the display unit 20 shown in FIG. 1A.

In the embodiment of the invention, the data is renewed along the width direction (X direction) of the drawings. The present invention may be applied to a device in which the data is renewed along the Y direction of the drawings.

In FIG. 2, a trend graph display area 22 is displayed at a display plane 21 of the display unit 20. The trend line 25 in the display area 22 is displayed on the basis of the contents of the memory 12. The contents of the memory 12 are processed by the data processing device 10. The trend data memory 12 includes the data values of each of sampling points (y direction displacement value $\Delta y$). Concretely, the display area in the trend data memory 12 is decided by the designations of a display read pointer 26 and a display read area pointer 27 in the memory 13, the co-ordinate value of one display point being calculated sequentially on the basis of an x direction renewed value $\Delta x$ of whole trend line 25, a y direction displacement value 24 ($\Delta y$) of one point (sampling unit) and the data in the memory 13. The display points are gathered, and these gathered points construct one trend line 25. Preferably, plural trend lines (n lines) are combined in order to display the trend graph.

The pointers 26 and 27 are set as an enlargement section attribute table 45 of the memory 13. The pointer 26 represents a drawing start point displayed at the area 22 or the address of the start of the reading data in the display data stored in the trend data memory 12. The address of the reading data corresponds to the x direction co-ordinate of the area 22. On the other hand, the pointer 27 represents the section of the data displayed at the area 22 or the width of the address.

The memory 12 stores the width data of the input data in the memory 6 required to the looper. The renewed value Ax in the x direction corresponding to the sampling period $\Delta t$ of the input data is set as a table 28 in the table 45. The data in the memory 21 is a renewed value $\Delta y$ in the y direction corresponding to the renewed value of each sampling point of the input data.

Figure 3:
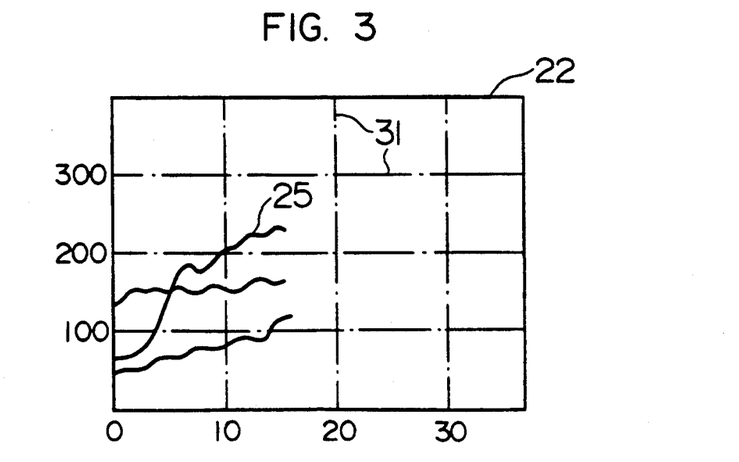
FIG. 3 is a drawing showing a display example of a trend graph.

FIG. 3 shows a display example of the trend graph of the display unit shown in FIG. 1 (FIG. 2). A trend graph consisting of n lines of the trend lines 25, ruled lines 31 and scales are displayed at the trend graph display area 22.

Figure 4:
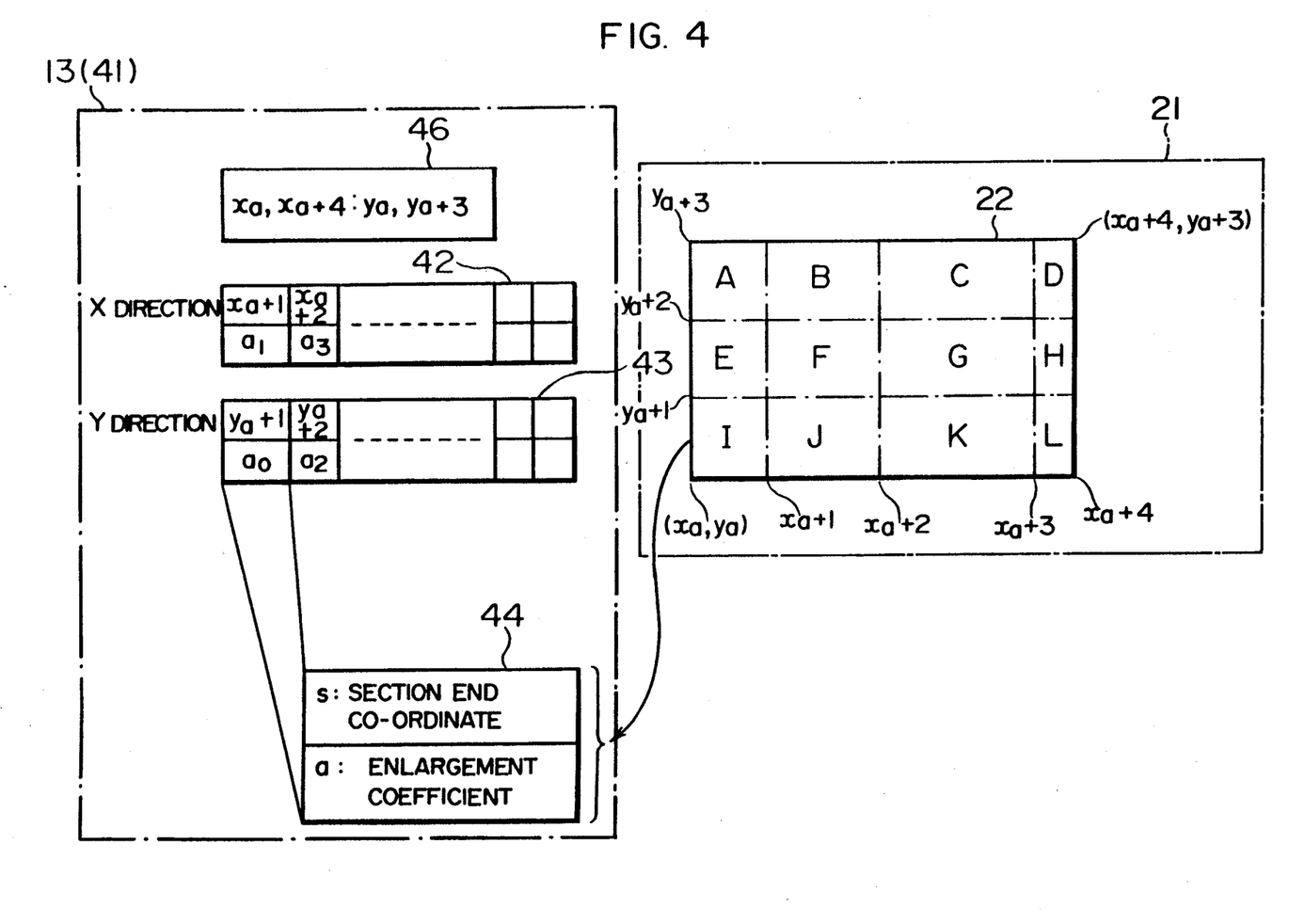
FIG. 4 is a drawing showing the relationship between a management table and partially enlarged and reduced display on the display area of a display plane.

FIG. 4 shows the relationship between the management table and the partially enlarged or reduced display in the display area of the display plane. In FIG. 4, in order to manage the process of the partially enlargement or reduction by the data processing device 10, a display area management table 46, an x direction partially enlargement or reduction management table 42 and a y direction partially enlargement or reduction management table 43 are installed as an enlargement section management table 41 in the memory 13. The trend graph display area 22 shown in FIG. 3 is changed to the trend graph display area 22 shown in FIG. 4 on the basis of the information of the table 41. A-L shown in FIG. 4 are blocks of the sections divided by enlargement coefficients corresponding to the blocks respectively. Whole area in each section includes the same scale factor (enlargement coefficient) in the x direction and the y direction.

The contents of the table 46 set the co-ordinate boundary values of the display area 22 on the display plane 21. In the embodiment shown in FIG. 4, the table 46 sets the co-ordinate boundary values $x_a$, $x_{a+4}$; $y_a$, $y_{a+3}$.

This area 22 can be set at any place of the display plane 21. Further, a plurality of areas 22 can be set at the display plane. Single area 22 will be described hereinafter for simplifying the explanation.

The information content 44 of one unit of each of the management tables 42 and 43 is the display section information consisting of a section end co-ordinates S and an enlargement coefficient a.

The section end co-ordinates S in the table 42 are the co-ordinates of the boundary of the section in the x direction (boundary co-ordinates), such as $x_{a+1}$, $x_{a+2}$, . . . . . The section end co-ordinates S in the table 43 are the co-ordinates of the boundary of the section in the y direction (boundary co-ordinates), such as $y_{a+1}$, $y_{a+2}$ and $y_{a+3}$. The plural sections are demarcated by the boundary co-ordinates. Whole area in each section have the same scale factor.

In the embodiment shown in FIG. 4, the scale factor of the sections A, E and I in the x direction is a factor $a_1$, that of the sections B, F and J in the x direction being a factor $a_3$; that of the sections I, J, K and L in the y direction being a factor $a_o$, that of the sections E, F, G and H in the y direction being a factor $a_2$.

The scale factors in a time scale direction, e.g. the section in the y direction perpendicularly to the x direction, such as the sections A, E and I are equal with each other in case that the data sampled at a predetermined period, such as the trend graph is displayed at the display plane.

The enlargement coefficient a is managed by the information at each of the sections having the same scale factor in the x and y directions respectively. The feature of the management conception of this embodiment is to define the enlargement coefficient a for partially enlarging or reducing by means of the points on the display plane, and to define the trend line 25 by means of the increments $\Delta x$ and $\Delta y$ of each display point.

The attribute table 45 shown in FIG. 1B further includes a background color management table 29 storing the information of the background colors in each of the sections A-L of the area 22.

The background color can be displayed at each of the sections in accordance with the above-described information.

Further, the scrawl capable for changing the positions of the sections having the same scale factor can be carried out by means of the change of the section end co-ordinates shown in FIG. 4.

Figure 5:
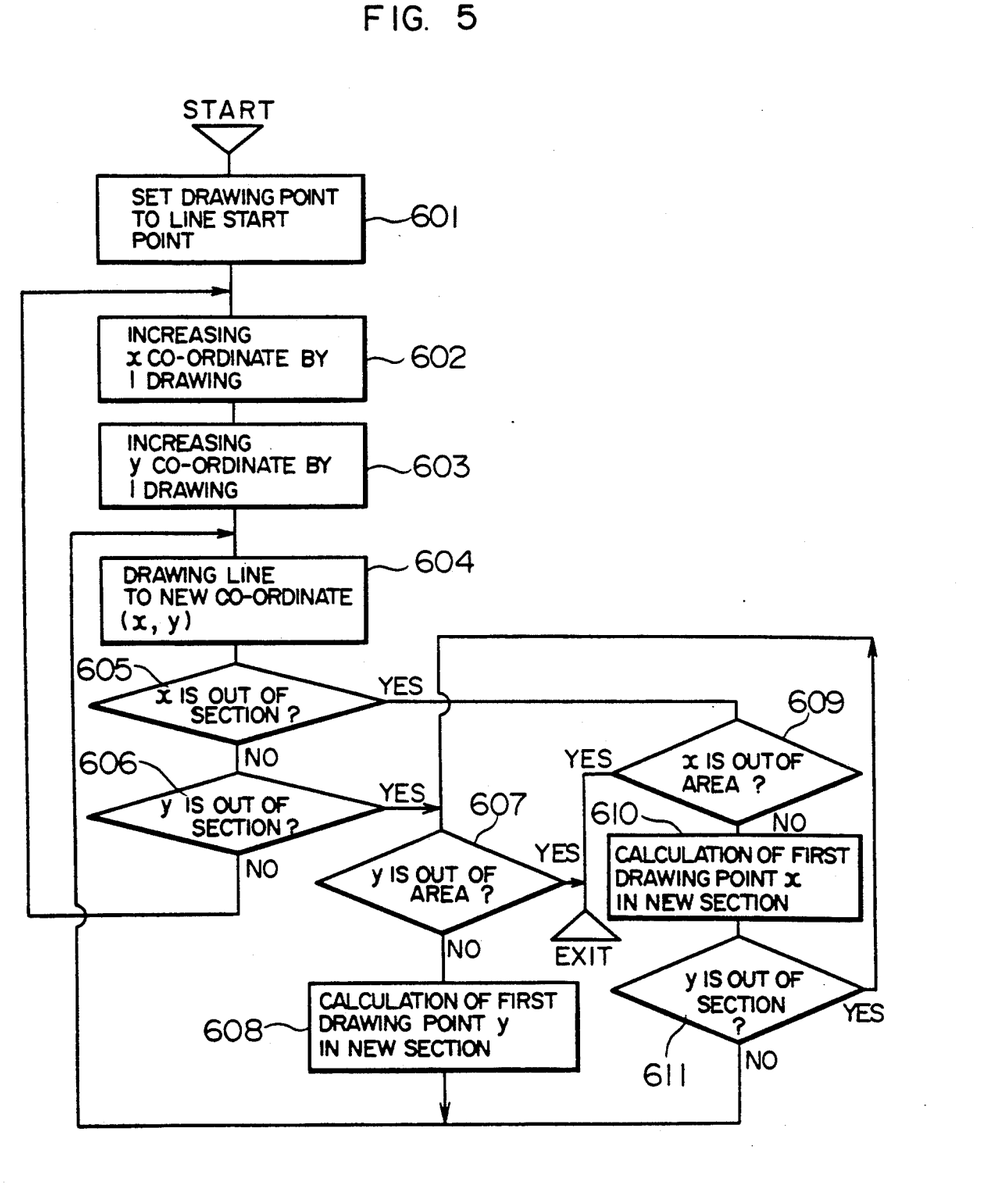
FIG. 5 is a flowchart for explaining the drawing process in a display device according to one embodiment of the present invention.

The drawing process of the trend graph by the data processing device 10 will be described hereinafter with reference to the flowchart shown in FIG. 5. The drawing process is carried out by the program stored in the ROM 16.

Figure 6A:
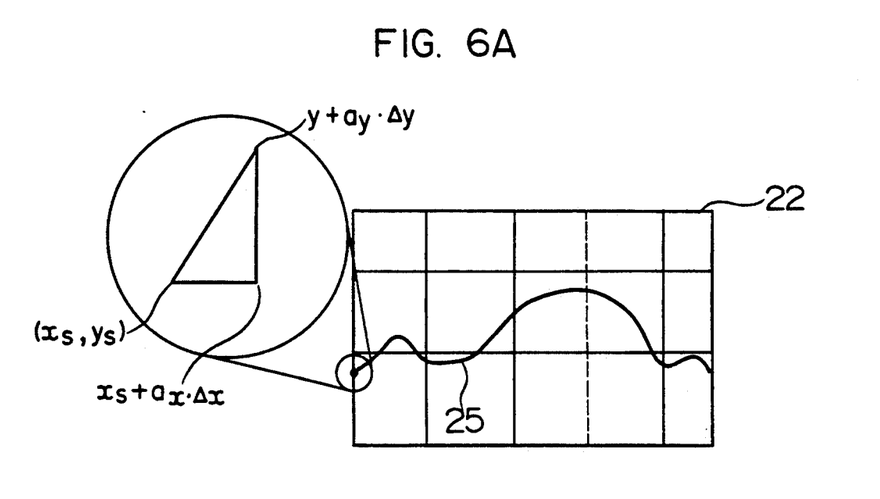
FIG. 6A is a drawing for explaining drawing logic.

On the basis of the management conception of the partial enlargement or reduction of FIG. 1, the logic for executing the actual drawing in the partial enlargement or reduction section will be described with reference to FIG. 6A.

Firstly, in a block 601, the drawing point is set to a co-ordinate ($x_s$, $y_s$) of the line start point of the trend line 25 designated by the pointer 26. In a block 602, a section corresponding to the co-ordinate ($x_s$, $y_s$) is retrieved from the tables 42 and 43, and the enlargement coefficient $a_x$ in the x direction of the retrieved section is read out from the table 42, and the multiplication $a_x \cdot \Delta x$ of the x direction increment $\Delta x$ of the trend line corresponding to one sampling time $\Delta t$ is added to the co-ordinate $x_s$, and the x co-ordinate $x_{s+1}$ of the next sampling point is obtained ($x_{s+1} = x_s + a_x \cdot \Delta x$).

In a block 603, the multiplication $a_y \cdot \Delta y$ of the displacement $\Delta y$ in the y direction read out from the memory 12 is added to the co-ordinate $y_s$, and the y co-ordinate $y_{s+1}$ of the next sampling point is obtained ($y_{s+1} = y_s + a_y \cdot \Delta y$).

In a next block 604, the line is drawn from the co-ordinate ($x_s$, $y_s$) to the calculated new co-ordinate ($x_{s+1}$, $y_{s+1}$) of the end point of one drawing while the new co-ordinate exists in the section of the start co-ordinate. Referring to the end co-ordinate S, it is checked whether the new co-ordinate exists in the section of the start co-ordinate or not. When the new co-ordinate (end point) is out of the section of the start co-ordinate, the drawing point is stopped on the boundary line of the section of the start co-ordinate, and the drawing process is waited until the first point co-ordinate ($x_{s+1}$, $y_{s+1}$) of a new end point in a new section is calculated at a following block 608 or 610. The drawing logic in case of the trend line extending over two sections will be described with reference to the FIG. 6B.

In the next block 605, it is judged whether the end co-ordinate $x_{s+1}$ is out of the section or not. If the end co-ordinate $x_{s+1}$ is in the section, it is judged whether the end co-ordinate $y_{s+1}$ is out of the section of not, at a block 606, and it is judged whether the end co-ordinate $y_{s+1}$ is out of the trend graph display area 22 or not, at a block 607. If the end co-ordinate $y_{s+1}$ is out of the display area 22, the process is finished. If the end co-ordinate $y_{s+1}$ is in the display area 22, the co-ordinate $y_{s+1}$ of the first drawing point in a new section is calculated at a block 608, and the data to be read out from the table 43 is renewed in response to the new section. The block is advanced to the block 604 from the block 608, and the drawing is carried out in the new section. If the MPU judges the co-ordinate $x_{s+1}$ being out of the section at the block 605, judging whether the end co-ordinate $x_{s+1}$ is out of the trend graph display area 22 or not at a block 609. If the end co-ordinate $x_{s+1}$ is out of the area 22, the process is finished. If the end co-ordinate $x_{s+1}$ is in the area 22, the co-ordinate $x_{s+1}$ of the first drawing point in a new section is calculated at the next block 610, and the data to be read out from the table 41 is renewed in response to the new section. The MPU judges whether the above end co-ordinate $y_{s+1}$ is out of the section or not at a block 611.

If the end co-ordinate $y_{s+1}$ is out of the section, the process is advanced to the block 607. If the end co-ordinate $y_{s+1}$ is in the section, the process is advanced to the block 604, and one line is drawn in the new section.

Figure 6B:
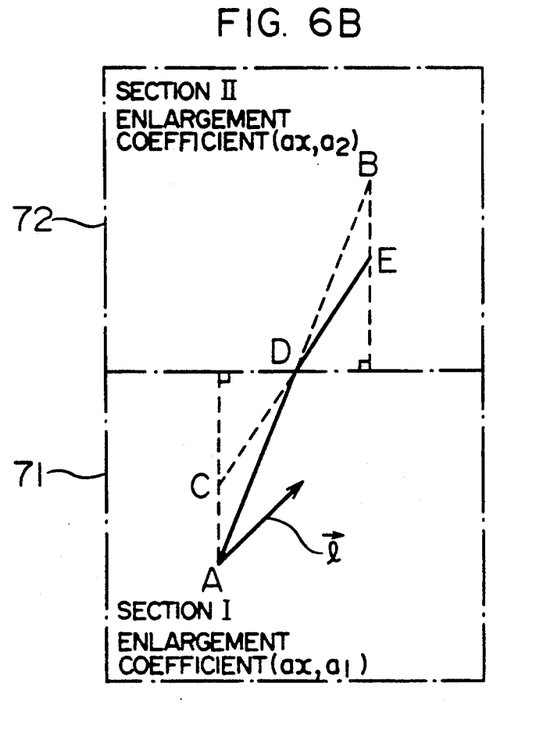
FIG. 6B is a drawing explaining the drawing logic in case that one drawing line extends over the plural sections.

FIG. 6B shows the logic conception of the drawing (calculation of a co-ordinate) in case that one trend line of the processing device 10 in FIG. 1 extends over plural sections. In FIG. 6B, the x direction enlargement coefficients of the sections I, 71 and II, 72 are $a_x$, and the y direction enlargement coefficients of these sections are $a_1$ and $a_2$. The x, y co-ordinates of the points A, B, C, D and E are (Ax, Ay), (Bx, By), (Cx, Cy), (Dx, Dy) and (Ex, Ey) respectively. The increment vector of one drawing line of the given trend data is $\vec{I}=(\Delta l_x, \Delta l_y)$. The drawing logic (calculation of co-ordinate) in this case is described below.

Firstly, a formal end point B (Bx, By) of the segment of the line of the increment vector $\vec{I}=(\Delta l_x, \Delta l_y)$ from the start point A (Ax, Ay) is calculated by means of an equation (Bx=Ax+$\Delta l_x \cdot a_x$, By=Ay+$\Delta l \cdot a_1$) in view of the enlargement coefficient ($a_x$, $a_1$) of the section I 71. Since the formal end point B is out of the section I 71, the segment $\overline{AB}$ of the line becomes the line $\overline{AD}$ (solid line) starting from the point A to the x co-ordinate Dx of the boundary point D of the sections I and II, and the segment $\overline{DB}$ (dotted line) is not drawn. The co-ordinate Dx of the point D is calculated from the following equation.

$$Dx = Dy/[K_1(ay-K_1 \cdot Ax)], [K_1 = \Delta l_y \cdot a_1/(\Delta l_y \cdot a_x)]$$

The section boundary co-ordinate Dy is read out from the table 43. A formal start point C (Cx, Cy) is calculated from the equation (Cx=Ax, Cy=(Ay−Dy)×($a_2/a_1$)+Dy). An end point E (Ex, Ey) of the segment of the line of the increment vector $\vec{I}$ starting from the formal start point C is calculated from the equation (Ex=Bx, Ey=(Ay−Dy)×($a_2/a_1$)+Dy+$\Delta l_y \cdot a_2$) in view of the enlargement coefficient ($a_x$, $a_2$) of the section II 72. Since the end point E is in the section II 72, the drawing of the segment line $\overline{DB}$ stopped at the boundary point D is started on the segment of the line $\overline{DE}$ (solid line), and the drawing of one trend data is finished at the end point E.

The line from the point A to the point E may be calculated directly from the following equations;

$$Ex = Ax + \Delta l_x \cdot a_x$$

$$Ey = Dy + \Delta l_y a_2 - K_2,$$

$$K_2 = (Dx - Ax)(\Delta l_y a_2)/(\Delta l_x a_x)$$

The calculating method for calculating the effective value of the scales, in which a plurality of sections having enlargement coefficient different from each other exist in the display area 22, will be described hereinafter.

Figure 7:
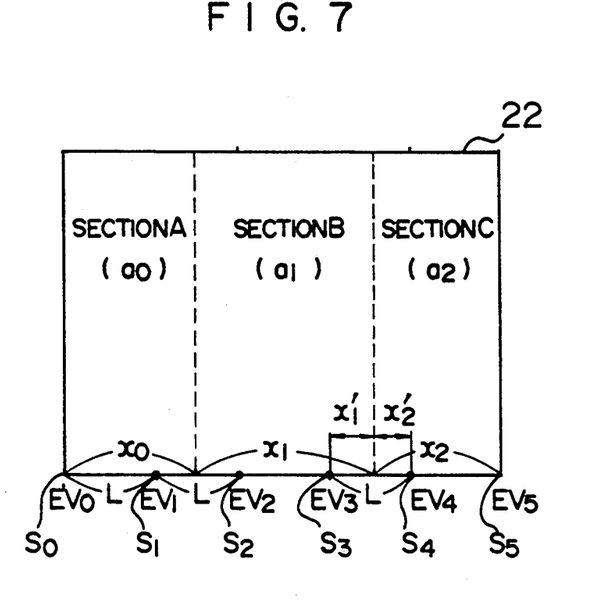
FIG. 7 is an explanatory drawing explaining a method for calculating the efficient value of the scale of the display area.

FIG. 7 shows the display area 22 of the display plane. The area is divided in the x direction into, for example, three sections A, B and C. The x direction enlargement coefficients of the sections A, B and C are $a_0$, $a_1$ and $a_2$ respectively. The y direction enlargement coefficients are equal with each other in the area. The distances in the x direction of the sections are $x_0$, $x_1$ and $x_2$, respectively.

The positions of the scales $S_0$, $S_1$, $S_2$ . . . . . of the display area are L in the x direction, and the value of the L can be set to any value of the scale interval table 50 in the table 45. Therefore, the positions of the x co-ordinates of the scale in the display areas are o, L, 2L, . . . . . . The values of the scales can be calculated sequentially from the left side of FIG. 7. If the last scale (the value of the scale is already obtained) and the present scale (the value of the scale is calculated at this time) are in the same section (for example, scales $S_2$ and $S_3$), the value of the present scale is easily obtained. However, if the section of the latest scale is not equal to that of the present scale (for example, scales $S_4$ and $S_3$), the effective value EV of the present scale (for example, $S_4$) is calculated from the following equation. The calculation of the effective value of this scale is carried out by the MPU 11 on the basis of the data in the memory 13.

$$EV_4 = (x'_1/a_1 + x'_2/a_2) \cdot R + EV_3,$$

$$L = x'_1 + x_2,$$

wherein the R is an increment of one scale of the L in case that the scale factor is 1, and the $x'_1$ is a distance between the position of the latest scale $S_3$ and the end point of the section B, and the $x'_2$ is a distance between the start point of the section C and the present scale $S_4$, and the $EV_3$ is the value of the latest scale.

The value of the R can be set as the table 51 in the table 45. The initial value $EV_0$ can be set in the table 45.

Figure 8A:
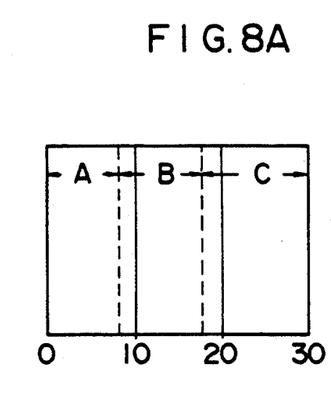
FIGS. 8A–8C are drawings showing the change of the display value of the scale in response to the partial enlargement and reduction.
Figure 8B:
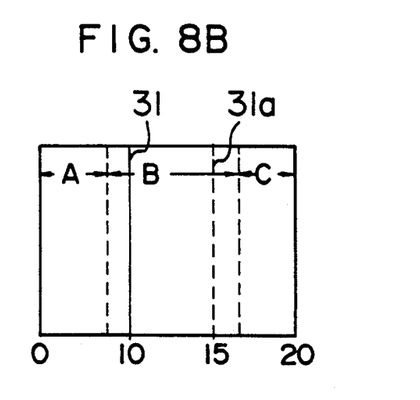
Figure 8C:
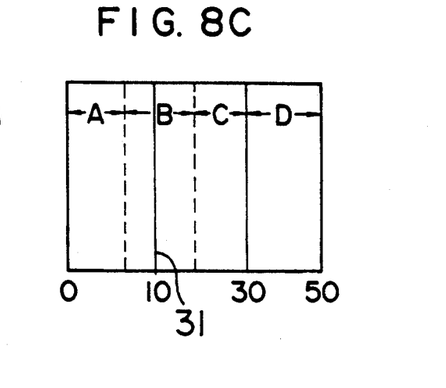

If the enlargement coefficient of a part of the sections is enlarged or reduced, as shown in FIGS. 8A to 8C, the values of the scales can be automatically changed as described above.

Ruled lines 31 may be drawn at the positions of the scales in the y direction. As shown in FIG. 8B, the kind of the ruled line in the enlarged scale section may be changed to, for example, a dotted line 31a. The data of the kinds of the ruled line are set as the table 52 in the table 45, and any kind of the ruled line may be selected by means of the key board.

Further, the background color of the section, in which the enlargement coefficient of the section is changed, may be changed.

The scales of the above example are displayed in the x direction. The scales, however, can be displayed in the y direction. Further, the scales can be displayed in the x and y directions. Similarly, the ruled lines can be drawn in the x direction. Further, the ruled lines can be drawn in the x and y directions.

An embodiment capable for partially enlarging and reducing the data automatically in response to the condition of the data is will be described with reference to the flowchart shown in FIG. 9. The operations of the flowchart are carried out by the MPU 11 using the program stored in the ROM 16.

In this embodiment, the input data of one point is supplied to the data processing device from the data collecting device 10 one by one, and one point is displayed at the display plane one by one. The objective data are, for example, plant data which is partially enlarged and reduced in accordance with the basic conditions described below.

(1) Firstly, an upper limit value Ul and lower limit value Ll are set to the input data values. If the input data reside in the range between the values Ul to Ll, the MPU 11 judges that the input data are in the normal range. If the input data do not reside in the normal range, the MPU 11 judges that the input data are in an abnormal range, and the section including the input data is enlarged and displayed at the display plane.

The upper and lower limit values Ul and Ll are set as an upper and lower limit setting table 54 in the table 45.

(2) If the input data reside in the normal range during a predetermined term (for example, all display areas range), the MPU 11 executes the enlargement display or looper until an abnormal value generates.

The enlargement and reduction display may be executed only in the x direction or only in the y direction. Further, the enlargement and reduction display may be executed in both x and y directions. The enlargement and reduction display, however, is executed only in the x direction in the embodiment described hereinafter.

Figure 9:
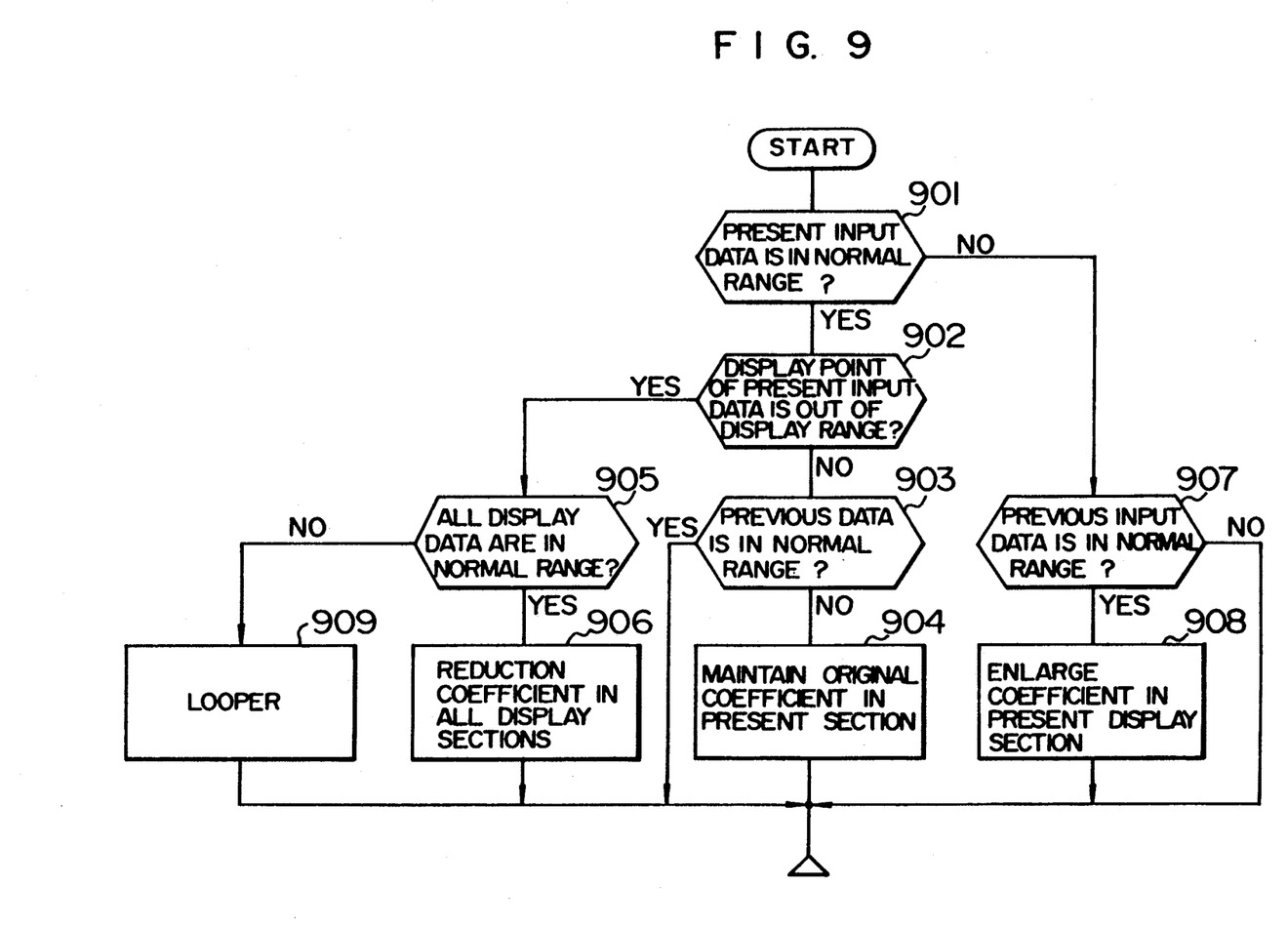
FIG. 9 is a flowchart of an embodiment capable for executing partial enlargement and reduction in accordance with the input data.
Figure 10A:
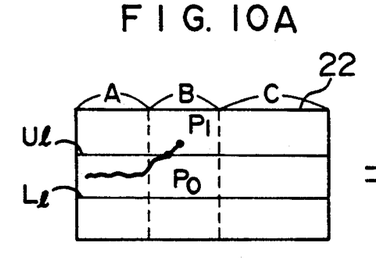
FIGS. 10A–10H and FIG. 11 are drawings showing the display examples of the trend data for explaining the operation of the flowchart shown in FIG. 9.
Figure 10B:
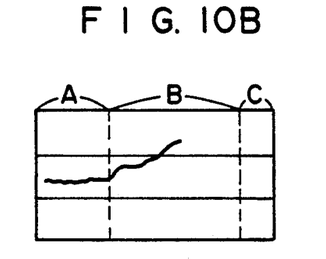

In FIG. 9, firstly, the present input data is checked with reference to the table 54 whether the present data resides in the normal range or not, at a step 901. If the present input data is an abnormal range as shown in FIG. 10A, it is judged whether the input data $P_0$ just before the present input data $P_1$ resides in the normal range or not, at a step 907. If the input data just before the present input data resides in the normal range, the enlargement coefficient of the section (the section B in FIG. 10B) including the present input data is increased (for example, the coefficient is doubled) and displayed as shown in FIG. 10B, at a step 908. On the other hand, if the input data just before the present data resides in the abnormal range, the present enlargement coefficient is held, and the enlargement display is continued, since the enlargement display is already executed. The above process is to display the abnormal data in detail.

Figure 10C:
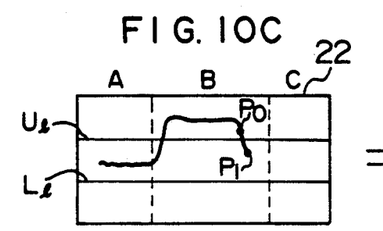
Figure 10D:
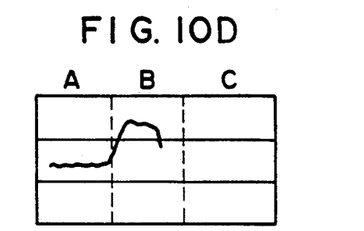

On the other hand, if it is judged that the present input data resides in the normal range at the step 901, it is judged whether the display point of the present input data is out of the display range, at a step 902. If the display point of the present input data resides in the display area, it is judged whether the input data just before the present input data resides in the normal range, at a step 903. If the input data just before the present data resides in the normal range, the enlargement coefficient of the section including the present input data is held. On the other hand, if the input data just before the present data resides in the abnormal range (FIG. 10C), the enlargement coefficient of the section including the present input data is returned to an original coefficient, and the original size of the input data is displayed as shown in FIG. 10D (step 904).

Figure 10E:
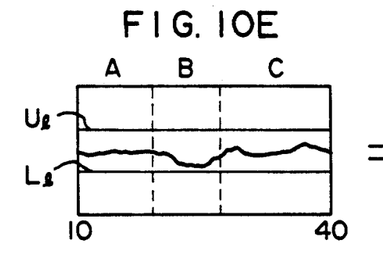
Figure 10F:
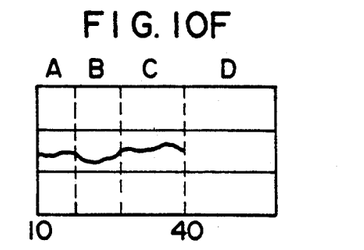

On the other hand, if the MPU 11 judges that the display point of the present input data is out of the display range at the step 902, it is judged whether all input data in the display plane are in the normal range or not at a step 905. If the all input data in the display plane are in the normal range (FIG. 10E), the coefficients of all sections of the display area are reduced (for example, the coefficients of all sections are set to as) and displayed at the display plane (FIG. 10F), at a step 906. This reason is that the data in the normal range is not required to be observed in detail.

Figure 10G:
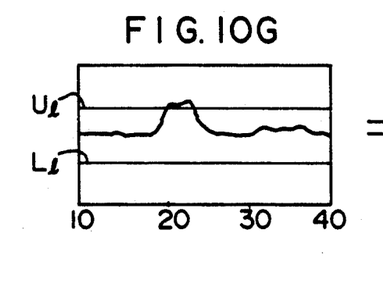
Figure 10H:
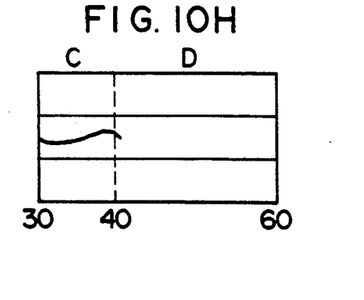

On the other hand, if a part of the data in the display plane resides in the abnormal range (FIG. 10G) at a step 905, the looper is executed at a step 909, as shown in FIG. 10H. The looper is executed by changing the positions of the pointers 26 and 27 shown in FIG. 2. The above process of the enlargement, reduction, looper or the like is one example, and a process different from the above process may be executed in accordance with the character of the input data.

Further, the process of the enlargement and reduction display may be executed in accordance with the operation modes of the plant. For example, the enlargement display may be executed only at the start operation of the plant.

Figure 11:
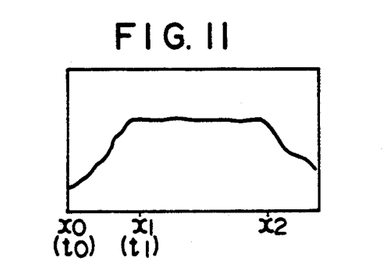

Furthermore, the upper and lower limits are made to be times not the values of the input data, the enlargement and reduction display may be executed during the co-ordinates $x_0 - x_1$ corresponding to the times $t_0 - t_1$, as shown in FIG. 11.

In this embodiment, a new enlargement coefficient is obtained by means of the increase or decrease of an enlargement coefficient in some section, and a corresponding coefficient in the table 41 is renewed, and the drawing calculation may be executed on the basis of the renewed coefficient.

According to the invention, the ruled lines and the scales displayed from the time of the enlargement coefficient $a = 1$ can be distinguished from the added ruled lines and the scales displayed from the time of the enlargement coefficient $a > 1$ because the kind of a line and display color of the ruled lines and the scales at one condition can be made to be different from those of the ruled lines and the scales at other condition.

As to the method for adding background color to each of the sections having a same enlargement coefficient of the trend graph, the blocks A-L of the sections having the same scale factor in the display area of the trend graph in FIG. 4 are smeared with the background color previously designated by a user, and the ruled line 31 and the trend line 25 are drawn after the color is smeared.

According to the invention,
(1) plural sections having the display scale factors (enlargement, reduction, normal) different from each other can be displayed at one trend graph,
(2) the density of the display of the chart line can be changed in accordance with the display scale factor of each section,
(3) the content of the scale can be changed in accordance with the density of the display of each section, and the display position (density) of the scale is not changed if an operator does not designate the change of the display position.
(4) the background color can be designated at each of the sections having the same display scale factor, and the change of the scale factor can be communicated to the operator with the change of the color. According to the above functions (1) to (4) of the present invention, the partial enlarged and reduced data mixed in the display can be realized, and the change of the scale factor can be communicated to the operator by using the ruled line, scale or background color.

Further, according to the invention,
(1) the tendency of the data change of whole system and the detail contents of the change of a part of data to be observed can be displayed simultaneously, so that the operator can observe the tendency of the data change of whole system and the change of the detail part of the data at real time,
(2) unnecessary information can be ignored by means of the reduction function, and necessary information can be picked up by means of the enlargement function, so that the edition function of a display device can be improved.

We claim:
1. A display device having a display memory and display means including a display plane for displaying contents of said display memory, comprising:

boundary co-ordinate setting means for setting co-ordinate values on said display plane of boundaries demarcating various display sections which are made by dividing a display area of said display plane into a plurality of areas, said various display sections being contiguous to each other;

co-ordinate memory means for storing said set boundary co-ordinate values;

input data memory means for storing input data having co-ordinate values corresponding to said display areas of said display plane;

display scale factor setting means for setting display scale factors of said input data of each of said display sections, said display scale factors including enlargement, reduction and normal scale factors;

scale factor memory means for storing said set display scale factors;

means for reading said display scale factors corresponding to said co-ordinate values of said input data read out from said input data memory on the basis of contents of said co-ordinate memory mans and said scale factor memory means; and operating means for operating enlargement or reduction of said co-ordinate values of said read input data in accordance with said read display scale factors, at a boundary between each of a plurality of surrounding display sections adjacent to a display section designated with a display scale factor different from display scale factors of said surrounding adjacent display sections, and said designated display section, said surrounding display sections surround said designated display section, performing a modification of co-ordinate values near said boundary to maintain continuity of display data in the display sections, converting said co-ordinate values into display data, and supplying said display data to said display memory;

wherein said plurality of display sections of said input data can be mixed and displayed on said display area of said display plane while maintaining continuity of the display data between adjacent display sections.

2. A display device according to claim 1, further comprising means for setting co-ordinates of said display areas, and means for storing the set co-ordinates of said display areas, wherein said operating means includes means for preparing said display data to be displayed at the position of said display plane defined by the co-ordinates of said set display areas.

3. A display device according to claim 1, wherein said display scale setting means sets at least one of scale factors of width direction and lengthwise direction of said display area as the display scale factor of said input data of each of said display sections.

4. A display device according to claim 1, further comprising means for setting display interval of ruled lines, and means for calculating display positions of said ruled lines in accordance with said set display interval of said ruled lines, wherein said operating means includes means for preparing said display data to display said ruled lines at the calculated display positions of said ruled line.

5. A display device according to claim 1, further comprising means for setting the display interval of scales, means for setting an increment of display value of one of said scales, means for calculating the display position of said scale in accordance with the set display interval of said scale, and means for calculating the display value at the display position of said scale in accordance with said display interval and said increment of said display value, wherein said operating means includes means for preparing said display data to display said display value at said calculated display position of said scale.

6. A display device according to claim 5, wherein the display position of said scale is equal to a display position of a ruled line.

7. A display device according to claim 5, wherein said scale and said ruled line are displayed at one of the width direction and the length direction of said display area respectively.

8. A display device according to claim 1, further comprising means for setting a background color of each of said display sections, and means for storing said set background colors, wherein said operating unit includes means for preparing said display data to display said stored background color of each of said display sections.

9. A display device according to claim 1, further comprising display scale factor renewing means for increasing or decreasing the display scale factor of said display section to obtain a new display scale factor in accordance with the condition of said input data, wherein said operating unit operates in accordance with said new display scale factor.

10. A display device according to claim 9, wherein said display scale factor renewing means includes means for judging whether a value of a present input data is in a predetermined range, and means for obtaining said new display scale factor by increasing corresponding display scale factor of the display section corresponding to said present input data when said present input data is out of said predetermined range.

11. A display device according to claim 9, wherein said display scale factor renewing means includes means for judging whether a display point of a present input data is out of said display area or not, and means for obtaining said new display scale factor by reducing enlargement coefficients of all display sections when said display point of said present input data is out of the display area.

12. A display device according to claim 9, wherein said display scale factor renewing means includes means for judging whether a display point of a present input data is out of said display area or not, and means for changing a reading start position of said input data read out from said input data memory means when said display point of said present input data is out of said display area, and said operating means operates in accordance with the input data read out from said changed start position.

13. A display device according to claim 1, further comprising a display scale factor renewing means for obtaining a new display scale factor by increasing or decreasing the display scale factor of said display section in accordance with modes of said input data, wherein said operating unit operates in accordance with said new display scale factor.

14. A display device having a display memory and display means including a display plane for displaying contents of said display memory, comprising:

boundary co-ordinate setting means for setting co-ordinate values on said display plane of boundaries demarcating various display sections which are made by dividing a display area of said display plane into a plurality of areas, said various display sections being contiguous to each other;

co-ordinate memory means for storing said set boundary co-ordinate values;

display scale factor setting means for setting display scale factors of input data of each of said display sections, said display scale factors including enlargement, reduction and normal scale factors;

scale factor memory means for storing said set display scale factors;

means for reading said display scale factors corresponding to said co-ordinate values of said input data having co-ordinate values corresponding to said display areas of said display plane on the basis of contents of said co-ordinate memory means and said scale factor memory means; and operating means for operating enlargement or reduction of said co-ordinate values of said input data in accordance with said read display scale factors, at a boundary between each a plurality of surrounding display sections adjacent to a display section designated with a display scale factor different from displays cale factors of said surrounding adjacent display sections, and said designated display section, said surrounding display sections surround said designated display section, performing a modification of co-ordinate values near said boundary to maintain continuity of display data in the display sections, converting said co-ordinate values into display data and supplying said display data to said display memory;

wherein the plurality of display sections of said input data can be mixed and displayed on said display area of said display plane and the input data is displayed continuously between adjacent display sections while maintaining the continuity of the display data.

15. A display device according to claim 14, wherein said operating means includes means for judging whether two input data across a boundary of adjacent display sections, and means for calculating a co-ordinate value on said display area of one of said two input data on the basis of a ratio between the read display scale factors of said two input data in response to the judgment.

16. A display device having a display means including a display area for displaying input data in sequence continuously in a line-like configuration, comprising:

co-ordinate memory means storing boundary co-ordinate values on said display area of boundaries demarcating various display sections which are made by dividing said display area into a plurality of areas, said various display sections being contiguous to each other;

scale factor memory means for storing display scale factors of said input data of each of said display sections, said display scale factors including at least one of enlargement, reduction and normal scale factors; said set display scale factors;

means for reading said display scale factors corresponding to said co-ordinate values of said input data having co-ordinate values corresponding to said display area on the basis of contents of said co-ordinate memory means and said scale factor memory means; and operating means for operating enlargement or reduction of said co-ordinate values of said input data in accordance with said read display scale factors to obtain co-ordinate values on said display area of said input data, converting co-ordinate values on said display area into display data supplying said display data to said display means and at a boundary between each of a plurality of surrounding display sections adjacent to a display section designated with a display scale factor different from display scale factors of said surrounding adjacent display sections, and said designated display section, said surrounding display sections surround said designated display section, performing a modification of co-ordinate values near said boundary to maintain continuity of display data in the display sections, wherein said plurality of display sections having different display scale factors of said input data can be mixed and displayed on said display area of said display plane while maintaining continuity of the display data between adjacent display sections.

17. A display device according to claim 16, wherein said operating means includes means for judging whether two contiguous input data cross a boundary of adjacent display sections, and means for obtaining a co-ordinate value on said display area of one of said two contiguous input data in response to the judgment.

18. A display device according to claim 16, wherein said operating means includes means for judging whether two contiguous input data cross a boundary of adjacent display sections, and means for obtaining a co-ordinate value on said display area of one of said two contiguous input data on the basis of the read display scale factors of said two input data in response to the judgment.

19. A display device according to claim 16, wherein said means for reading reads the display factor corresponding to said co-ordinate value on said display area of present input data, and said operating means obtains a co-ordinate value on said display area of next input data succeeding to the present input data which is the sum of the co-ordinate value on said display area of the present input data and a value which is obtained by multiplying a difference between the co-ordinate values of the present and the next input data by the display scale factor corresponding to the co-ordinate value on said display area of the present input data.

20. A display device according to claim 19, wherein said operating means includes means for judging whether the co-ordinate values on said display area of said present and next input data cross a boundary of adjacent display sections, and means for obtaining a co-ordinate value on said display area of said next input data on the basis of the read display scale factors of said present and next input data in response to the judgment.

21. A display device according to claim 18, wherein said operating means includes means for obtaining a co-ordinate in the vicinity of said boundary of said adjacent display sections positioned between said co-ordinate values on said display area of said two contiguous input data.

22. A display device according to claim 16, wherein said input data is data of a trend graph.

23. A method of displaying data for displaying input data in sequence continuously in a line-like configuration for use in a display device which has display means including a display area for displaying the input data, co-ordinate memory means for storing boundary co-ordinate values on said display area of boundaries demarcating various display sections which are contiguous to each other and made by dividing said display area into a plurality of areas, and scale factor memory means for storing display scale factors of said input data of each of said display sections, said display scale factors including at least one of enlargement, reduction and normal scale factors, said method comprising the steps of:

reading said display scale factors corresponding to co-ordinate values of said input data having co-ordinate values corresponding to said display area on the basis of the contents of said co-ordinate memory means and said scale factor memory means; and operating enlargement or reduction of said co-ordinate values of said input data in accordance with said read display scale factors to obtain co-ordinate values on said display area of said input data, converting co-ordinate values on said display area into display data supplying, said display data to said display means and at a boundary between each of a plurality of surrounding display sections adjacent to a display section designated with a display scale factor different from display scale factors of said surrounding adjacent display sections, and said designated display section, said surrounding display sections surround said designated display section, performing a modification of co-ordinate values near said boundary to maintain continuity of display data in the display sections, wherein said plurality of display sections having different display scale factors of said input data can be mixed and displayed on said display area while maintaining continuity of the display data between adjacent display sections.

24. A data display method according to claim 23, wherein said step of operating includes a step of judging whether two contiguous input data cross a boundary of adjacent display sections, and a step of obtaining a co-ordinate value on said display area of one of said two contiguous input data in response to the judgment.

25. A data display method according to claim 23, wherein said step of operating includes a step of, when two contiguous input data cross a boundary of adjacent display sections, obtaining a co-ordinate value on said display area of one of said two contiguous input data on the basis of the read display scale factors of said two input data in response to the judgment.

26. A method of displaying data for displaying input data in sequence continuously in a line-like configuration for use in a display device which has display means including a display area for displaying the input data, co-ordinate memory means for storing boundary co-ordinate values on said display area of boundaries demarcating various display sections which are contiguous to each other and made by dividing said display area into a plurality of areas, and scale factor memory means for storing display scale factors of said input data of each of said display sections, said display scale factors including at least one of enlargement, reduction and normal scale factors, said method comprising the steps of:

reading the display factor corresponding to said co-ordinate value on said display area of the present invention data on the basis of contents of said co-ordinate memory means and said scale factor memory means.

obtaining a co-ordinate value on said display area of next input data succeeding to the present input data which is the sum of the co-ordinate value on said display area of the present input data and a value which is obtained by multiplying a difference between the coordinate values of the present and next input data by the display scale factor corresponding to the co-ordinate value on said display area of the present input data; and displaying said present and next input data at positions on said display area corresponding to said co-ordinate values on said display area of the present and next input data.

27. A display method according to claim 26, further comprising the step of, when the co-ordinate values on said display area of said present and next input data cross a boundary of adjacent display sections, obtaining a co-ordinate value on said display area of said next input data on the basis of the read display scale factors of said present and next input data in response to the judgment.

28. A display method according to claim 27, further comprising the step of, when the co-ordinate values on said display area of said present and next input data cross a boundary of adjacent display sections, obtaining a boundary co-ordinate in the vicinity of said boundary of said adjacent display sections positioned between said co-ordinate values on said display area of said two contiguous input data and displaying said boundary co-ordinate at a position on said display area corresponding to said boundary co-ordinate values on said display area.

29. A display method according to claim 26, wherein said input data is data of a trend graph.

* * * * *